(12) United States Patent
Shimizu et al.

(10) Patent No.: US 10,566,451 B2
(45) Date of Patent: Feb. 18, 2020

(54) SEMICONDUCTOR DEVICE, SEMICONDUCTOR DEVICE MANUFACTURING METHOD, POWER SUPPLY CIRCUIT, AND COMPUTER

(71) Applicant: Kabushiki Kaisha Toshiba, Minato-ku (JP)

(72) Inventors: Tatsuo Shimizu, Shinagawa (JP); Toshiya Yonehara, Kawasaki (JP); Akira Mukai, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 16/111,768

(22) Filed: Aug. 24, 2018

(65) Prior Publication Data

US 2019/0280111 A1    Sep. 12, 2019

(30) Foreign Application Priority Data

Mar. 6, 2018 (JP) ................. 2018-039275

(51) Int. Cl.
*H01L 29/778* (2006.01)
*H01L 29/423* (2006.01)
(Continued)

(52) U.S. Cl.
CPC ...... *H01L 29/7786* (2013.01); *H01L 21/2233* (2013.01); *H01L 21/2236* (2013.01);
(Continued)

(58) Field of Classification Search
CPC ............ H01L 29/7786; H01L 21/2233; H01L 21/2236
See application file for complete search history.

(56) References Cited

U.S. PATENT DOCUMENTS 9,165,851 B2   10/2015 Ozaki et al.
2011/0037101 A1  2/2011 Nakazawa et al.
(Continued)

FOREIGN PATENT DOCUMENTS

JP   2008-218696   9/2008
JP   2011-14789    1/2011
(Continued)

OTHER PUBLICATIONS

Song, D., et al. "Normally Off AlGaN/GaN Low-Density Drain HEMT (LDD-HEMT) With Enhanced Breakdown Voltage and Reduced Current Collapse", IEEE Electron Device Letters, vol. 28, No. 3, 2007, 3 pages.

*Primary Examiner* — Errol V Fernandes
(74) *Attorney, Agent, or Firm* — Oblon, McClellland, Maier & Neustadt, L.L.P.

(57) ABSTRACT

A semiconductor device according to an embodiment includes a first nitride semiconductor layer; a second nitride semiconductor layer located on the first nitride semiconductor layer, a first and second electrode located on or above the first nitride semiconductor layer; a trench located in the second nitride semiconductor layer between the first electrode and the second electrode, and including a bottom surface and a side surface, the bottom surface being located in one of the first nitride semiconductor layer and the second nitride semiconductor layer; a gate electrode located in the trench; a gate insulating layer located between the bottom surface and the gate electrode and between the side surface and the gate electrode; and a region located in at least one of the first nitride semiconductor layer and the second nitride semiconductor layer, including a first portion adjacent to the bottom surface, and containing fluorine.

12 Claims, 13 Drawing Sheets

(51) Int. Cl.
  *H01L 29/207*  (2006.01)
  *H01L 29/205*  (2006.01)
  *H01L 21/3065* (2006.01)
  *H01L 29/66*   (2006.01)
  *H01L 21/223*  (2006.01)
  *H01L 29/20*   (2006.01)

(52) U.S. Cl.
  CPC ...... *H01L 21/3065* (2013.01); *H01L 29/2003* (2013.01); *H01L 29/205* (2013.01); *H01L 29/207* (2013.01); *H01L 29/4236* (2013.01); *H01L 29/66462* (2013.01)

(56) References Cited

U.S. PATENT DOCUMENTS

2013/0092958 A1*  4/2013  Chen ................... H01L 29/2003
                                                  257/77
2014/0353720 A1* 12/2014  Inoue .................. H01L 29/7827
                                                  257/192
2018/0026107 A1   1/2018  Shimizu et al.

FOREIGN PATENT DOCUMENTS

| JP | 2013-65613      | 4/2013  |
| JP | 2018-14456      | 1/2018  |
| WO | WO 2009/147774 A1 | 12/2009 |

\* cited by examiner

VN STRUCTURE

VN-3F STRUCTURE

VN-3FF STRUCTURE

SEMICONDUCTOR DEVICE, SEMICONDUCTOR DEVICE MANUFACTURING METHOD, POWER SUPPLY CIRCUIT, AND COMPUTER

CROSS-REFERENCE TO RELATED APPLICATION

This application is based upon and claims the benefit of priority from Japanese Patent Application No. 2018-039275, filed on Mar. 6, 2018, the entire contents of which are incorporated herein by reference.

FIELD

Embodiments described herein relate generally to a semiconductor device, a semiconductor device manufacturing method, a power supply circuit and a computer.

BACKGROUND

For circuits such as switching power supply circuits and inverter circuits, semiconductor devices such as transistors and diodes are used. It is demanded that these semiconductor devices have a high breakdown voltage and low on-resistance. Furthermore, a relationship between a breakdown voltage and the on-resistance is a tradeoff relationship determined according to a semiconductor material.

Due to an advancement of technology, the high breakdown voltage and the low on-resistance of the semiconductor devices has become closer to a limit of potential of silicon that is a major semiconductor material. It is necessary to change a semiconductor material to further improve the breakdown voltage and further reduce the on-resistance. By using a nitride semiconductor such as a gallium nitride or an aluminum gallium nitride as a semiconductor material of semiconductor devices, it is possible to improve a tradeoff relationship determined according to the semiconductor material. Consequently, it is possible to realize higher breakdown voltage and lower on-resistance of semiconductor devices.

A transistor for which a nitride semiconductor is used generally adopts an HEMT (High Electron Mobility Transistor) structure that uses a two dimensional electron gas (2DEG) as a carrier. A conventional HEMT is a normally on transistor that is conducted without applying a voltage to a gate. Therefore, it is difficult to realize a normally off transistor that is not conducted unless a voltage is applied to a gate.

By applying to the HEMT a gate recess structure that a gate electrode is provided in a trench (recess), it is possible to increase a threshold voltage and realize the normally off transistor. It is possible to reduce a two dimensional electron gas density under a gate electrode by providing the gate electrode in a trench or increase the threshold voltage of the HEMT by extinguishing the two dimensional electron gas.

DETAILED DESCRIPTION

Figure 1:
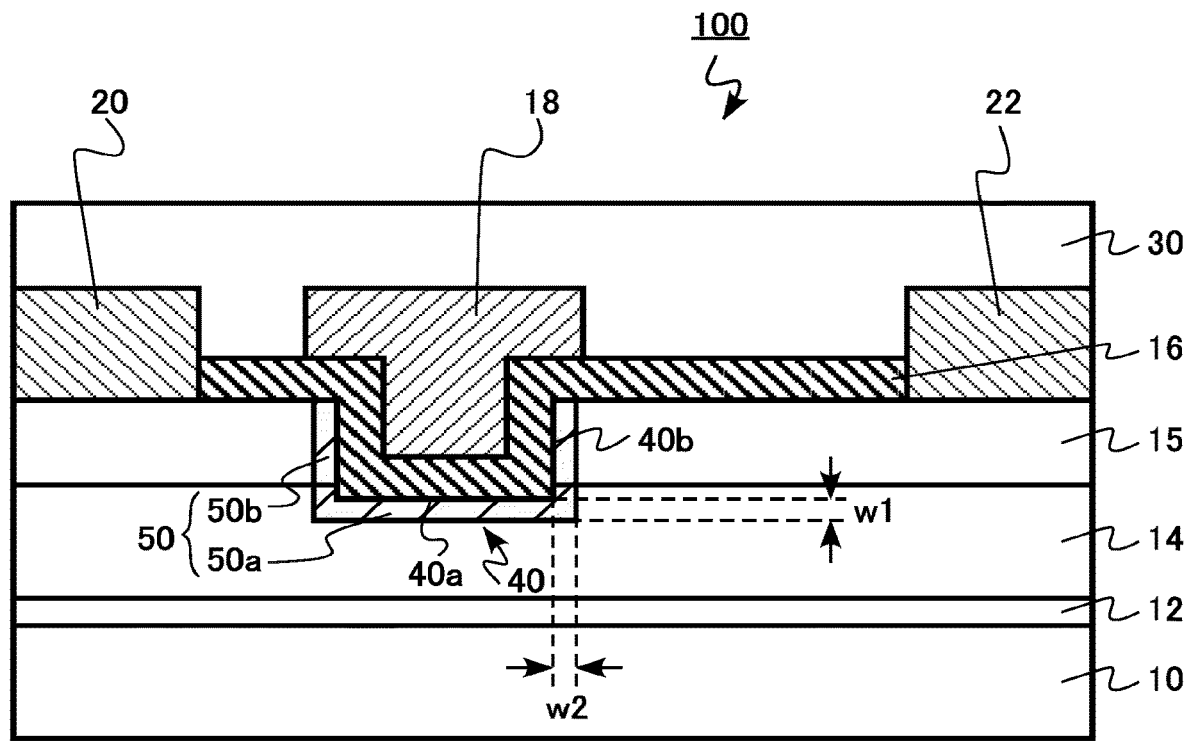
FIG. 1 is a schematic cross-sectional view of a semiconductor device according to a first embodiment.

A semiconductor device according to an embodiment includes: a first nitride semiconductor layer; a second nitride semiconductor layer located on the first nitride semiconductor layer, and the second nitride semiconductor layer having a larger band gap than a band gap of the first nitride semiconductor layer; a first electrode located on or above the first nitride semiconductor layer, and the first electrode electrically connected to the first nitride semiconductor layer; a second electrode located on or above the first nitride semiconductor layer, and the second electrode electrically connected to the first nitride semiconductor layer; a trench located in the second nitride semiconductor layer between the first electrode and the second electrode, the trench including a bottom surface and a side surface, and the bottom surface being located in one of the first nitride semiconductor layer and the second nitride semiconductor layer; a gate electrode located in the trench; a gate insulating layer located between the bottom surface and the gate electrode and between the side surface and the gate electrode; and a region located in at least one of the first nitride semiconductor layer and the second nitride semiconductor layer, the region including a first portion adjacent to the bottom surface, and the region containing fluorine.

Embodiments of the present disclosure will be described below with reference to the drawings. In addition, the same reference numerals will be assigned to the same or similar members below, and description of the members that are described once will be omitted in some cases.

In this description, a "nitride semiconductor layer" includes a "GaN-based semiconductor". The "GaN-based semiconductor" is a collective term of a semiconductor including a gallium nitride (GaN), an aluminum nitride (AlN) and an indium nitride (InN), and an intermediate composition of these.

In this description, "undoped" means that an impurity concentration is $1 \times 10^{15}$ cm$^{-3}$ or less.

In this description, an upper direction in the drawings will be referred to as an "upper side" and a lower direction in the drawings will be referred to as a "lower side" to indicate a positional relationship between parts. In this description, concepts of the "upper side" and the "lower side" are not necessarily terms indicating a relationship with a gravitational direction.

First Embodiment

A semiconductor device according to the first embodiment includes: a first nitride semiconductor layer; a second nitride semiconductor layer located on the first nitride semiconductor layer, and including a larger band gap than a band gap of the first nitride semiconductor layer; a first electrode located on or above the first nitride semiconductor layer, and electrically connected to the first nitride semiconductor layer; a second electrode located on or above the first nitride semiconductor layer, and electrically connected to the first nitride semiconductor layer; a trench located between the first electrode and the second electrode, and including a bottom surface and a side surface, the bottom surface being located in the first nitride semiconductor layer; a gate electrode located in the trench; a gate insulating layer located between the bottom surface and the gate electrode and between the side surface and the gate electrode; and a region located in at least one of the first nitride semiconductor layer and the second nitride semiconductor layer, including a first portion adjacent to the bottom surface, and containing fluorine. Further, the region includes a second portion adjacent to the side surface of the trench.

FIG. 1 is a schematic cross-sectional view of a semiconductor device according to the first embodiment. The semiconductor device is an HEMT (High Electron Mobility Transistor) 100 that adopts an MIS structure for which a GaN-based semiconductor is used. The HEMT 100 includes a gate recess structure that a gate electrode is provided in a trench (recess).

The HEMT 100 includes a substrate 10, a buffer layer 12, a channel layer 14 (first nitride semiconductor layer), a barrier layer 15 (second nitride semiconductor layer), a gate insulating layer 16, a gate electrode 18, a source electrode 20 (first electrode), a drain electrode 22 (second electrode), an inter-layer insulating layer 30, a trench 40 and a fluorine region 50 (region).

The trench 40 includes a bottom surface 40a and a side surface 40b. The bottom surface 40a of the trench 40 is located in the channel layer 14. The gate insulating layer 16 and the gate electrode 18 are formed in the trench 40. The bottom surface 40a of the trench 40 is located in the channel layer 14 to extinguish a two dimensional electron gas under the gate electrode 18. Consequently, it is possible to realize a normally off operation.

The substrate 10 is formed by, for example, silicon (Si). In addition to silicon, for example, sapphire (Al$_2$O$_3$) and silicon carbide (SiC) are also applicable.

The buffer layer 12 is provided on the substrate 10. The buffer layer 12 includes a function of alleviating a lattice mismatch between the substrate 10 and the channel layer 14. The buffer layer 12 is formed by, for example, a multilayer structure of aluminum gallium nitride (Al$_w$Ga$_{1-w}$N (0<W≤1)).

The channel layer 14 is provided on the buffer layer 12. The channel layer 14 is also referred to as an electron transit layer. The channel layer 14 is, for example, an undoped aluminum gallium nitride (Al$_x$Ga$_{1-x}$N (0≤X<1)). More specifically, the channel layer 14 is, for example, undoped gallium nitride (GaN). The film thickness of the channel layer 14 is, for example, 0.1 μm or more and 10 μm or less.

The barrier layer 15 is provided on the channel layer 14. The barrier layer 15 is also referred to as an electron supply layer. A band gap of the barrier layer 15 is larger than a band gap of the channel layer 14. The barrier layer 15 is, for example, an undoped aluminum gallium nitride (Al$_y$Ga$_{1-y}$N (0<Y≤1 and X<Y)). More specifically, the barrier layer 15 is, for example, an undoped Al$_{0.25}$Ga$_{0.75}$N. The film thickness of the barrier layer 15 is, for example, 10 nm or more and 100 nm or less.

A portion between the channel layer 14 and the barrier layer 15 is a heterojunction interface. A two dimensional electron gas (2DEG) is formed as a carrier of the HEMT 100 on the heterojunction interface.

The source electrode 20 is provided on or above the channel layer 14 and the barrier layer 15. The source electrode 20 is electrically connected to the channel layer 14 and the barrier layer 15. The source electrode 20 is in contact with, for example, the barrier layer 15.

The source electrode 20 is, for example, a metal electrode. The source electrode 20 is, for example, a stacked structure of titanium (Ti) and aluminum (Al). An Ohmic contact is desirably formed between the source electrode 20 and the barrier layer 15.

The drain electrode 22 is provided on or above the channel layer 14 and the barrier layer 15. The drain electrode 22 is electrically connected to the channel layer 14 and the barrier layer 15. The drain electrode 22 is in contact with, for example, the barrier layer 15.

The drain electrode 22 is, for example, a metal electrode. The drain electrode 22 is, for example, a stacked structure of titanium (Ti) and aluminum (Al). An Ohmic contact is desirably formed between the drain electrode 22 and the barrier layer 15.

A distance between the source electrode 20 and the drain electrode 22 is, for example, 5 μm or more and 30 μm or less.

In addition, the source electrode 20 and the drain electrode 22 can adopt, for example, a structure that is in contact with the channel layer 14.

The trench 40 is provided in the barrier layer 15 between the source electrode 20 and the drain electrode 22. The trench 40 includes a bottom surface 40a and a side surface 40b. The bottom surface 40a of the trench 40 is located in the channel layer 14. Although not illustrated, before the trench 40 is formed, a silicon nitride film or an aluminum nitride film may be formed and a process may proceed while this film remains. In this case, the silicon nitride film or the aluminum nitride film is formed between the barrier layer 15 and the gate insulating layer 16 on the channel layer 14. From a viewpoint of protection of a surface of the barrier layer 15, a structure that sandwiches the silicon nitride film or the aluminum nitride film is preferable.

At least part of the gate electrode 18 is formed in the trench 40. The gate electrode 18 is provided on the barrier layer 15. The gate electrode 18 is provided between the source electrode 20 and the drain electrode 22.

The gate electrode 18 is, for example, polycrystalline silicon containing a conductive impurity. Furthermore, the gate electrode 18 is, for example, a metal. The gate electrode 18 is, for example, a titanium nitride (TiN).

At least part of the gate insulating layer 16 is formed in the trench 40. The gate insulating layer 16 is located between the channel layer 14 and the gate electrode 18. The gate insulating layer 16 is located between the bottom surface 40a of the trench 40 and the gate electrode 18 and between the side surface 40b of the trench 40 and the gate electrode 18.

The gate insulating layer 16 is formed on the barrier layer 15 between the gate electrode 18 and the drain electrode 22, too. The gate insulating layer 16 is formed on the barrier layer 15 between the gate electrode 18 and the source electrode 20, too.

The gate insulating layer 16 is, for example, an oxide or an oxynitride. The gate insulating layer 16 is, for example, a silicon oxide, an aluminum oxide, a silicon oxynitride or an aluminum oxynitride.

The thickness of the gate insulating layer 16 is, for example, 20 nm or more and 100 nm or less. The equivalent oxide thickness (EOT) of the silicon oxide of the gate insulating layer 16 is, for example, 20 nm or more and 40 nm or less.

The fluorine region 50 is located in the channel layer 14 and the barrier layer 15 around the trench 40. The fluorine region 50 includes a first portion 50a and a second portion 50b. The fluorine region 50 is a nitride semiconductor containing fluorine (F).

The first portion 50a is adjacent to the bottom surface 40a of the trench 40 in the channel layer 14. The first portion 50a is located near the bottom surface 40a of the trench 40 in the channel layer 14. The first portion 50a is in contact with the bottom surface 40a of the trench 40. The second portion 50b is adjacent to and near the side surface 40b of the trench 40 in the barrier layer 15. The second portion 50b is in contact with the side surface 40b of the trench 40.

The width of the fluorine region 50 is, for example, 5 nm or less. The width (w1 in FIG. 1) of the first portion 50a is, for example, 5 nm or less. The width (w2 in FIG. 1) of the second portion 50b is, for example, 5 nm or less.

The width of the fluorine region 50 is a distance from the bottom surface 40a or the side surface 40b of the trench 40 to an end portion of the fluorine region 50. The end portion of the fluorine region 50 is defined as, for example, a position at which a fluorine concentration lowers by two digits from a peak value.

The fluorine concentration of the fluorine region 50 is, for example, $1 \times 10^{19}$ cm$^{-3}$ or more and $1 \times 10^{22}$ cm$^{-3}$ or less. The fluorine concentration of the fluorine region 50 can be expressed by, for example, a peak value of the fluorine concentration obtained by measurement. The fluorine concentration of the first portion 50a is higher than, for example, the fluorine concentration of the second portion.

The fluorine region 50 contains three fluorine atoms existing at a nitrogen atom position of a crystal lattice of the nitride semiconductor. The fluorine region 50 contains a first fluorine atom bonded to a first gallium atom and a second gallium atom, a second fluorine atom bonded to the first gallium atom and a third gallium atom, and a third fluorine atom bonded to the first gallium atom and a fourth gallium atom.

A semiconductor layer, types of elements of a semiconductor region and element concentrations can be measured by, for example, SIMS (Secondary Ion Mass Spectrometry) or EDX (Energy Dispersive X-ray Spectroscopy). Furthermore, a relative level of the element concentration can be decided based on a level of a carrier concentration measured by, for example, SCM (Scanning Capacitance Microscopy). Furthermore, the depth, the thickness, the width and a distance such as an interval of an impurity region can be measured by, for example, SIMS. Furthermore, the depth, the thickness, the width and the distance such as an interval of an impurity region can be measured from, for example, an image obtained by comparing an SCM image and an atom probe image.

Furthermore, a bonded state of the atoms in the fluorine region 50 can be determined by, for example, XPS (X-ray Photoelectron Spectroscopy). Furthermore, a bonded state or a distribution state of the atoms in the fluorine region 50 can be determined by, for example, XAFS (X-ray Absorption Fine Structure).

Next, an example of the semiconductor device manufacturing method according to the first embodiment will be described. FIGS. 2, 3, 4, 5 and 6 are schematic cross-sectional views illustrating the semiconductor device manufacturing method according to the first embodiment.

The semiconductor device manufacturing method according to the first embodiment includes: forming a trench including a bottom surface and a side surface in a nitride semiconductor layer; performing first plasma processing in an atmosphere containing a nitrogen trifluoride after forming the trench; forming a gate insulating layer in the trench; and forming a gate electrode on the gate insulating layer.

First, the substrate 10 such as a silicon substrate is prepared. Next, a multilayer structure of the aluminum gallium nitride that forms the buffer layer 12 is formed by, for example, epitaxial growth on the silicon substrate. The buffer layer 12 is grown by, for example, a metal organic chemical vapor deposition (MOCVD) method.

Figure 2:
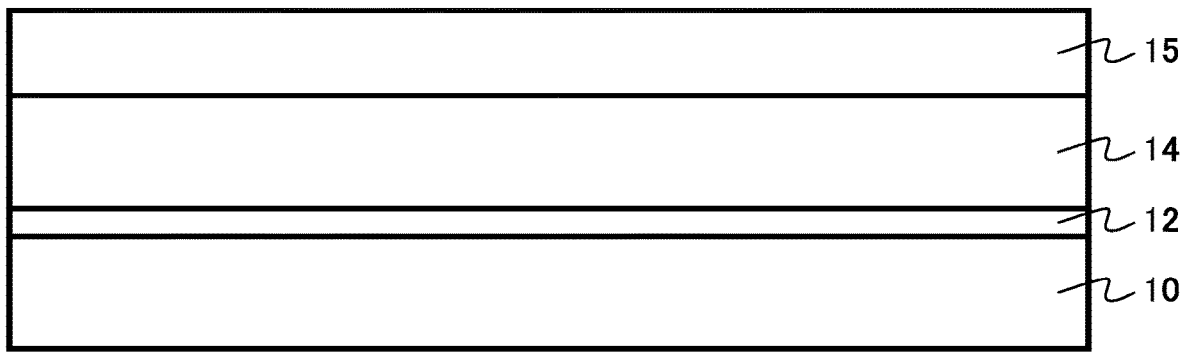
FIG. 2 is a schematic cross-sectional view illustrating a semiconductor device manufacturing method according to the first embodiment.

Next, the undoped gallium nitride that forms the channel layer 14 (first nitride semiconductor layer) and the undoped aluminum gallium nitride that forms the barrier layer 15 (second nitride semiconductor layer) are formed on the buffer layer 12 by epitaxial growth (FIG. 2). The channel layer 14 and the barrier layer 15 are grown by, for example, the MOCVD method.

Figure 3:
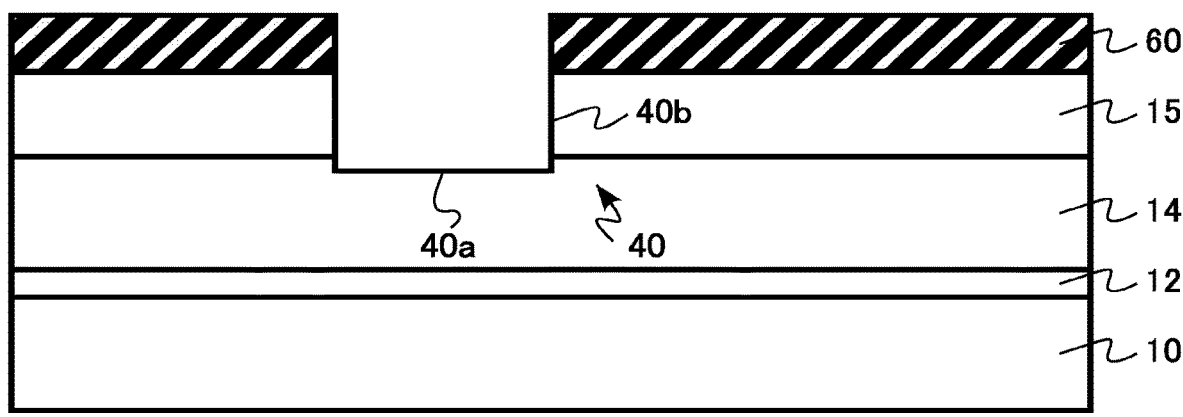
FIG. 3 is a schematic cross-sectional view illustrating the semiconductor device manufacturing method according to the first embodiment.

Next, the trench 40 is formed in the barrier layer 15 and the channel layer 14 by using a mask member 60 as a mask (FIG. 3). The trench 40 penetrates the barrier layer 15 and reaches the channel layer 14. The trench 40 includes the bottom surface 40a and the side surface 40b.

The mask member 60 is, for example, a silicon nitride film. The trench 40 is formed by, for example, a reactive ion etching method (RIE method). The trench 40 is etched by, for example, using a gas containing chlorine.

Figure 4:
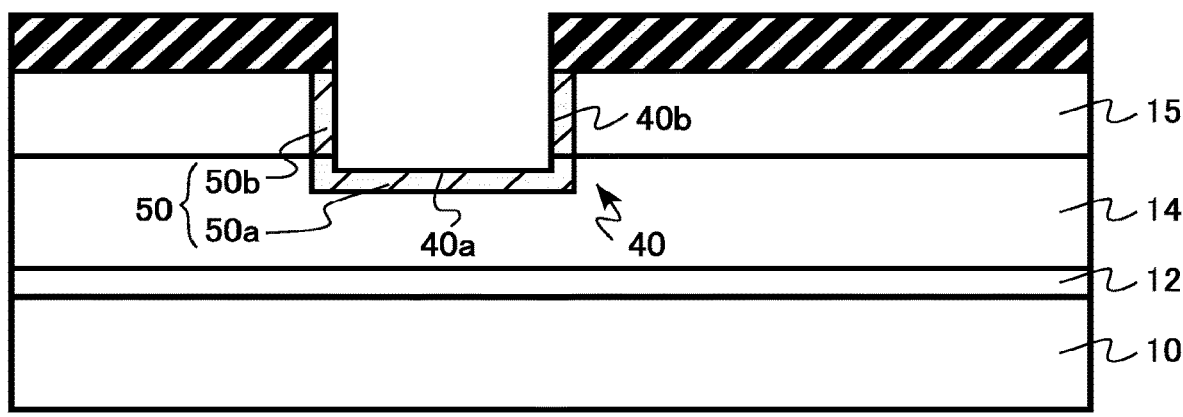
FIG. 4 is a schematic cross-sectional view illustrating the semiconductor device manufacturing method according to the first embodiment.

Next, first plasma processing is performed in an atmosphere containing a nitrogen trifluoride (NF) (FIG. 4). The fluorine region 50 is formed by the first plasma processing. The fluorine region 50 includes the first portion 50a and the second portion 50b.

Figure 5:
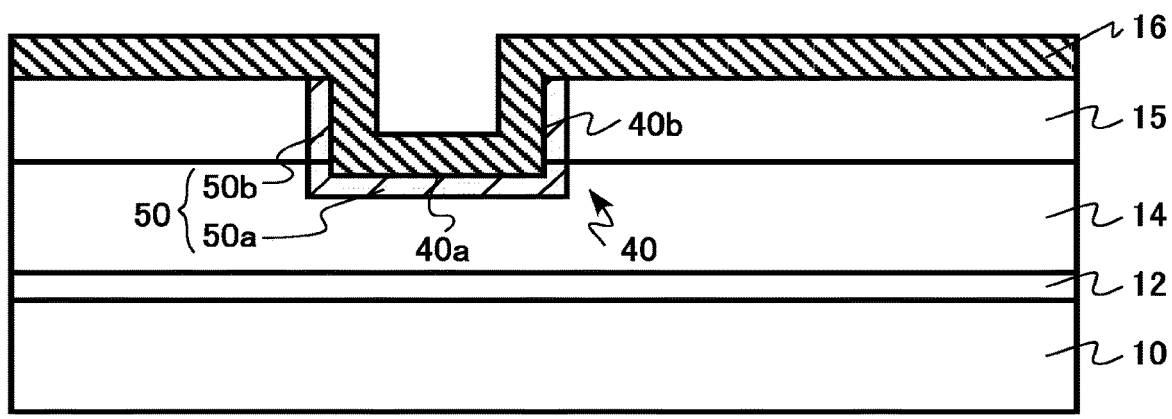
FIG. 5 is a schematic cross-sectional view illustrating the semiconductor device manufacturing method according to the first embodiment.

Next, the gate insulating layer 16 is formed on the channel layer 14 and the barrier layer 15 (FIG. 5). The gate insulating layer 16 is an oxide or an oxynitride. The gate insulating layer 16 is, for example, a silicon oxide, an aluminum oxide, a silicon oxynitride or an aluminum oxynitride. An amorphous $Si_3N_4$ film that is 0.5 nm or more and less than 5 nm or a crystallized AlN film that is 0.5 nm or more and less than 5 nm is preferably inserted in the interface between the channel layer 14 and the gate insulating layer 16, and between the barrier layer 15 and the gate insulating layer 16 from a viewpoint of prevention of nitrogen out diffusion from the channel layer 14 and the barrier layer 15. When the amorphous $Si_3N_4$ film or the crystallized AlN film is less than 0.5 nm, the amorphous $Si_3N_4$ film or the crystallized AlN film hardly functions as a nitrogen supply source. When the amorphous $Si_3N_4$ film or the crystallized AlN film is 5 nm or more, the amorphous $Si_3N_4$ film or the crystallized AlN film is likely to become a trap.

The gate insulating layer 16 is formed by, for example, a chemical vapor deposition (CVD) method.

Next, heat processing is performed at 800° C. or more and 1000° C. or less. The gate insulating layer 16 is densified by the heat processing.

Figure 6:
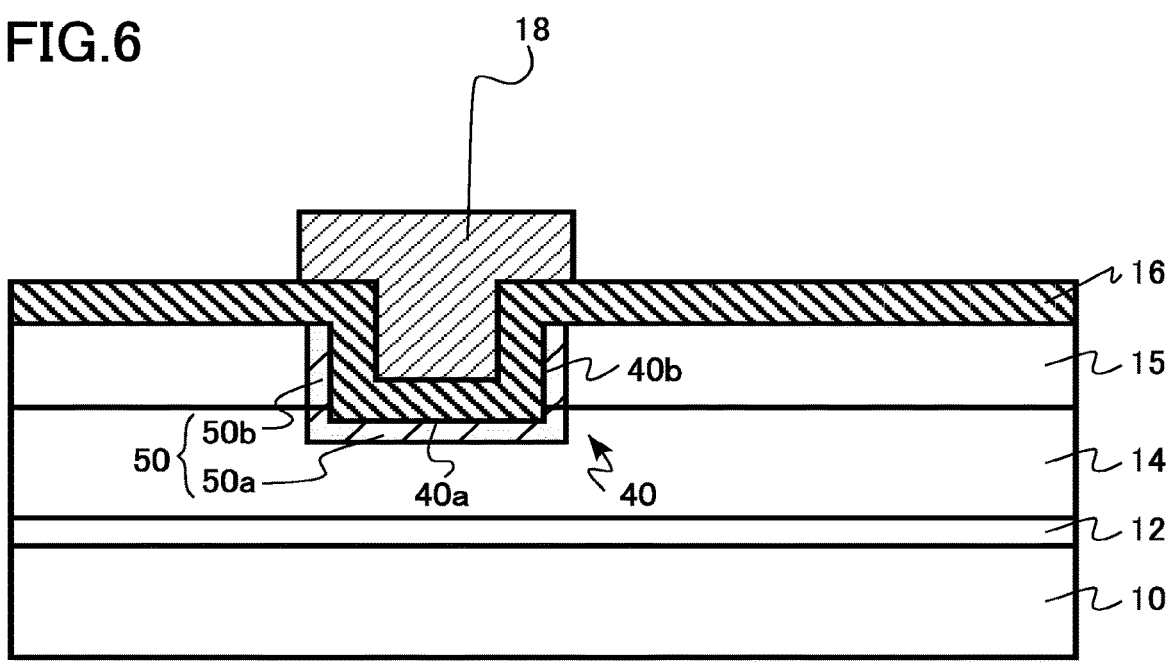
FIG. 6 is a schematic cross-sectional view illustrating the semiconductor device manufacturing method according to the first embodiment.

Next, the gate electrode 18 is formed on the gate insulating layer 16 (FIG. 6). The gate electrode 18 is, for example, polycrystalline silicon containing a conductive impurity. Furthermore, the gate electrode 18 is, for example, a metal. The gate electrode 18 is, for example, a titanium nitride (TiN).

The gate electrode 18 is formed by, for example, forming a conductive film by the CVD method or a sputtering method, and patterning by a lithography method and a dry etching method.

Next, the source electrode 20, the drain electrode 22 and the inter-layer insulating layer 30 are formed by a known method.

According to the above manufacturing method, the HEMT 100 illustrated in FIG. 1 is formed.

A function and an effect of the semiconductor device and the semiconductor device manufacturing method according to the first embodiment will be described.

A transistor for which a nitride semiconductor is used adopts an HEMT structure that uses a two dimensional electron gas (2DEG) as a carrier. A normal HEMT is a normally on transistor that is conducted without applying a voltage to a gate. Therefore, it is difficult to realize a normally off transistor that is not conducted unless a voltage is applied to a gate.

By applying to the HEMT a gate recess structure that a gate electrode is provided in a trench (recess), it is possible to increase a threshold voltage and realize the normally off transistor. It is possible to reduce a two dimensional electron gas density under a gate electrode by providing a gate electrode in a trench or increase the threshold voltage by extinguishing the two dimensional electron gas.

However, even an HEMT to which the gate recess structure is applied cannot obtain an expected rise in a threshold voltage. One of causes is that a damage caused by etching for forming a trench contributes to formation of nitrogen vacancies. The semiconductor device according to the first embodiment is provided with the fluorine region 50 containing fluorine of a high concentration to reduce the number of nitrogen vacancies caused by the etching damage. Consequently, it is possible to increase a threshold voltage of the HEMT adopting the gate recess structure. Details will be described below.

Figure 7A:
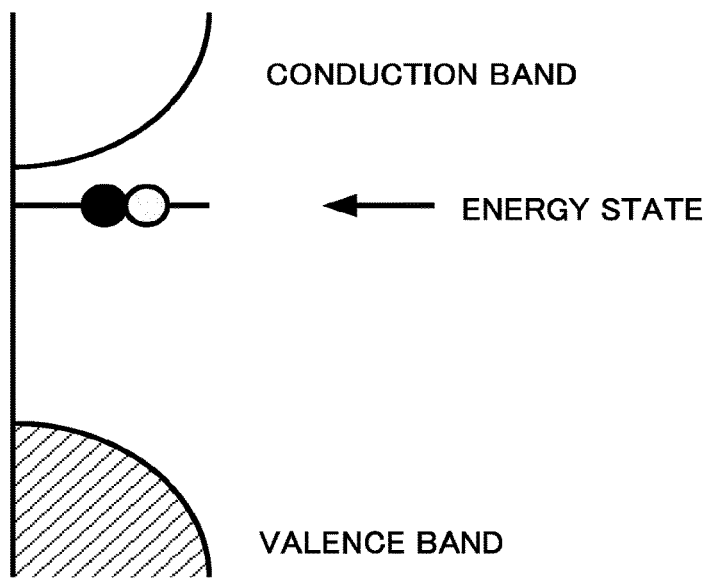
FIGS. 7A and 7B are explanatory views of a function and an effect of the first embodiment.
Figure 7B:
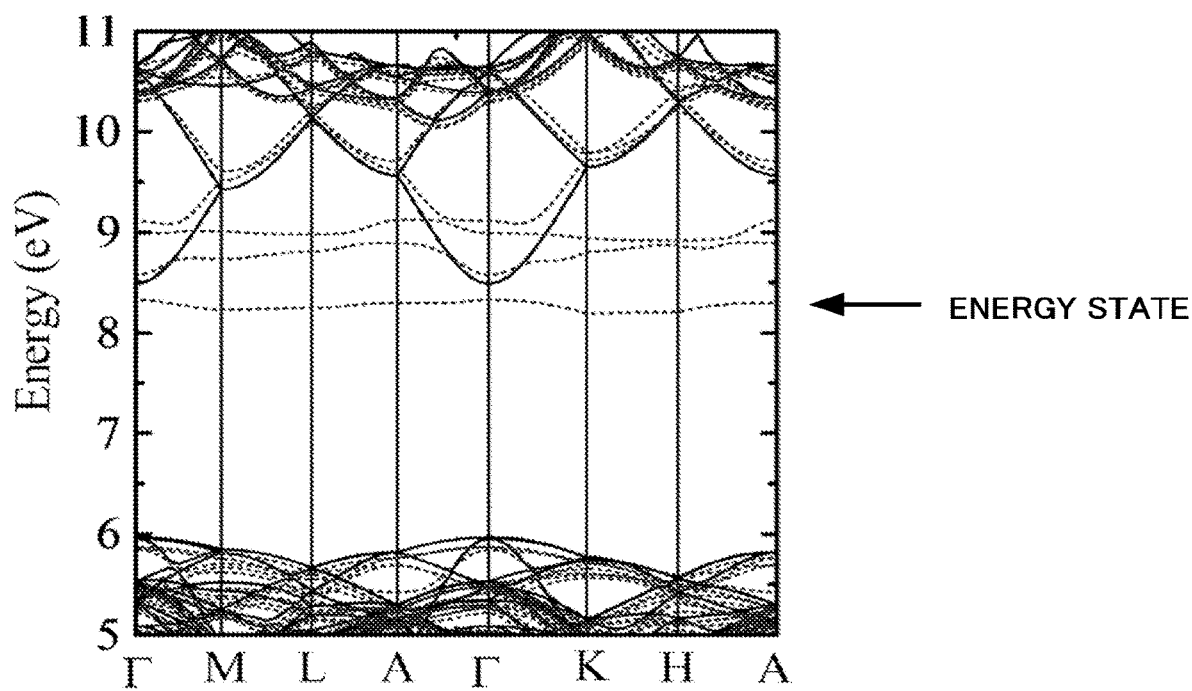

FIGS. 7A and 7B are explanatory views of the function and the effect of the first embodiment. FIGS. 7A and 7B are the explanatory views of an energy state formed by the nitrogen vacancies in a gallium nitride. FIG. 7A is a schematic view of a band structure, and FIG. 7B illustrates a calculation result of the band structure according to first principles calculation.

As illustrated in FIGS. 7A and 7B, the nitrogen vacancies form the energy state near a lower end of a conduction band of a gallium nitride. In addition, a black circle in FIG. 7A indicates an energy state filled with electrons, and a white circle indicates an energy state that are not filled with electrons. The energy state formed by the nitrogen vacancies is near the lower end of the conduction band, and therefore is a donor level for emitting electrons.

When a trench is formed by the RIE method, ions accelerated in a high electric field collide with a bottom surface and a side surface of the trench. The ion collision causes an etching damage in a nitride semiconductor layer. The etching damage contributes to formation of a great number of nitrogen vacancies in the nitride semiconductor layer around the trench.

The nitrogen vacancies are at the donor level, and therefore the nitride semiconductor layer around the trench becomes an n-type semiconductor. Hence, a threshold voltage of the HEMT lowers.

Figure 8A:
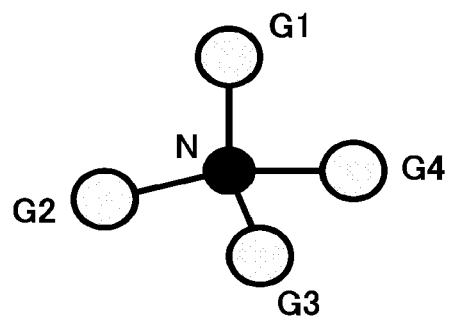
FIGS. 8A, 8B and 8C are explanatory views of the function and the effect of the first embodiment.
Figure 8B:
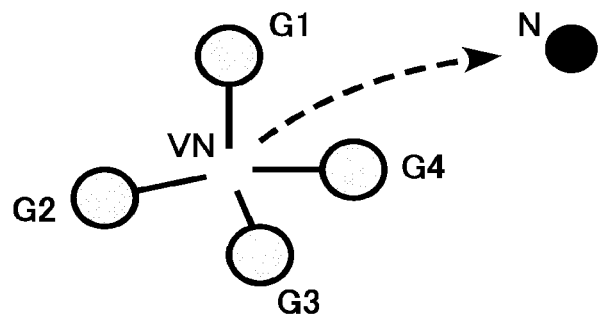
Figure 8C:
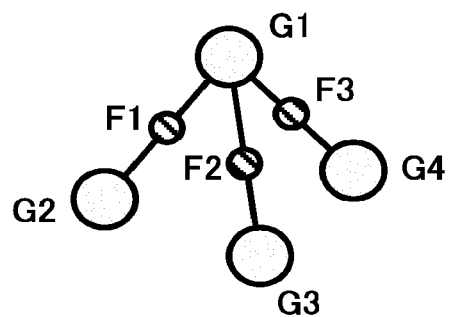

FIG. 8 is an explanatory view of the function and the effect of the first embodiment. FIGS. 8A, 8B and 8C illustrate a tetrahedral structure formed by gallium atoms existing in a crystalline structure of a gallium nitride. FIG. 8A illustrates a basic structure, FIG. 8B illustrates a nitrogen vacancy structure and FIG. 8C illustrates a structure according to the first embodiment.

In the basic structure in FIG. 8A, a nitrogen atom (N) is located at a center portion of the tetrahedral structure formed by the first gallium atom (G1), the second gallium atom (G2), the third gallium atom (G3) and the fourth gallium atom (G4).

FIG. 8B illustrates a structure that the nitrogen atom (N) is released from the center portion of the tetrahedral structure, and the nitrogen vacancy (VN) is formed. The structure in FIG. 8B will be referred to as a VN structure below.

The fluorine region 50 according to the first embodiment includes the structure illustrated in FIG. 8C. That is, the fluorine region 50 adopts the structure including the three fluorine atoms existing at nitrogen atom positions of a crystal lattice of the gallium nitride. In other words, the fluorine region 50 adopts the structure in which the three fluorine atoms are substituted for one nitrogen atom existing in a crystalline structure of the gallium nitride.

More specifically, the structure includes the first fluorine atom (F1) to be bonded to the first gallium atom (G1) and the second gallium atom (G2), the second fluorine atom (F2) to be bonded to the first gallium atom (G1) and the third gallium atom (G3), and the third fluorine atom (F3) to be bonded to the first gallium atom (G1) and the fourth gallium atom (G4). The structure in FIG. 8C will be referred to as a VN-3F structure below. The first principles calculation by the inventors has revealed that the VN-3F structure is stable. In addition, the VN-3F structure can be easily generated from a state where VN exists, yet is not easily generated from the basic structure (FIG. 8A) without the VN since an energy barrier is high.

The VN-3F structure may includes a first fluorine atom bonded to a first atom and a second atom, a second fluorine atom bonded to the first atom and a third atom, a third fluorine atom bonded to the first atom and a fourth atom, the first atom is an atom selected from the group consisting of gallium atom, aluminum atom and indium atom, the second atom is an atom selected from the group consisting of gallium atom, aluminum atom and indium atom, the third atom is an atom selected from the group consisting of gallium atom, aluminum atom and indium atom, and the fourth atom is an atom selected from the group consisting of gallium atom, aluminum atom and indium atom. The VN-3F structure shown in FIG. 8C is one example of the VN-3F structure when the first atom, the second atom, the third atom and the fourth atom are all gallium atom. The first atom, the second atom, the third atom and the fourth atom may include different kinds of atoms. For example, if the nitride semiconductor is aluminum gallium nitride, the first atom, the second atom, the third atom and the fourth atom may include both gallium atom and aluminum atom.

Figure 9A:
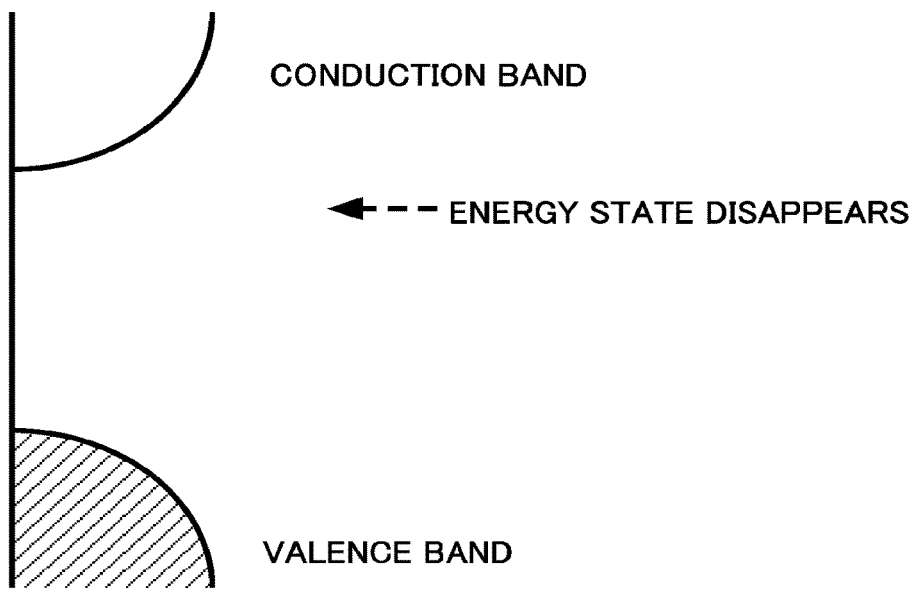
FIGS. 9A and 9B are explanatory views of the function and the effect of the first embodiment.
Figure 9B:
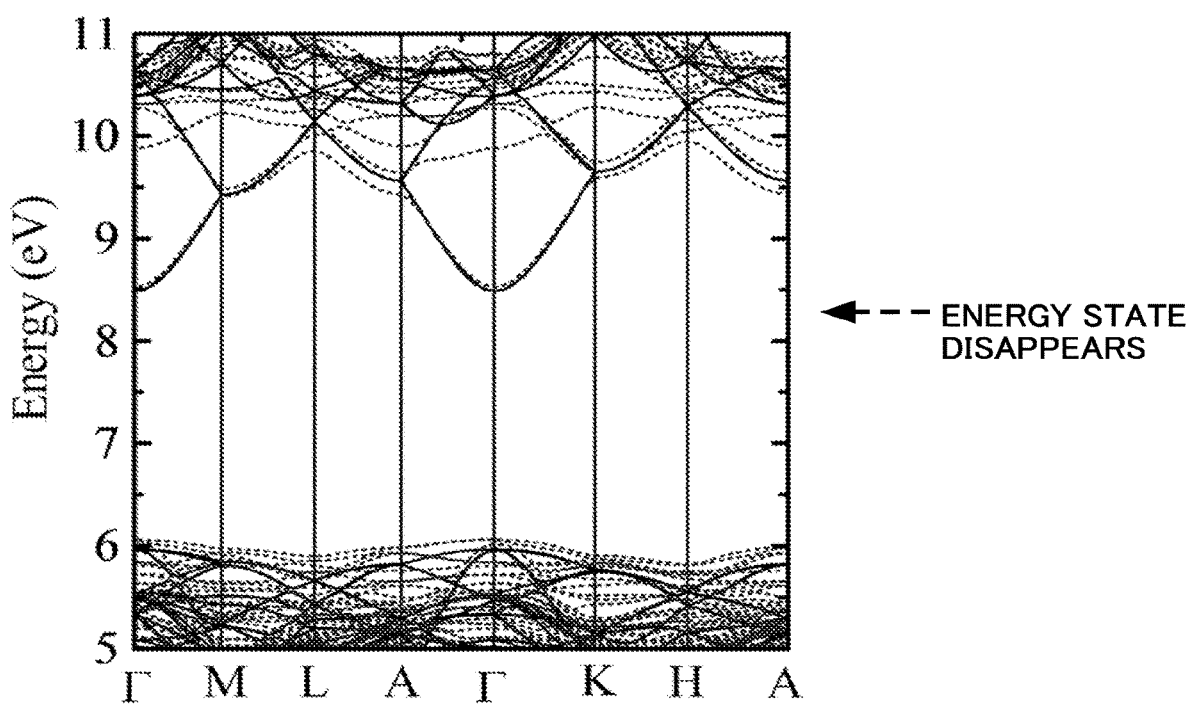

FIGS. 9A and 9B are explanatory views of the function and the effect of the first embodiment. FIGS. 9A and 9B are explanatory views of the VN-3F structure. FIG. 9A is a schematic view of a band structure, and FIG. 9B illustrates a calculation result of the band structure according to the first principles calculation.

As illustrated in FIGS. 9A and 9B, in the VN-3F structure, the donor level formed by the nitrogen vacancies disappears. The HEMT 100 according to the first embodiments includes the fluorine region 50 in a region including a great number of nitrogen vacancies around the trench 40. Hence, the donor level formed by the nitrogen vacancies is reduced. Consequently, the threshold voltage of the HEMT 100 is prevented from lowering. Consequently, it is possible to realize the HEMT 100 having a high threshold voltage.

According to the semiconductor device manufacturing method according to the first embodiment, the trench 40 is formed by the RIE method, and then the first plasma processing is performed in the atmosphere containing the nitrogen trifluoride ($NF_3$). A great number of nitrogen vacancies produced by etching the trench 40 are filled with the three fluorine atoms by the first plasma processing.

Each of fluorine atoms and a nitrogen atom constituting the nitrogen trifluoride can fill nitrogen vacancies. Consequently, it is possible to efficiently extinguish nitrogen vacancies.

Furthermore, reactivity of the nitrogen trifluoride and a nitride semiconductor is lower than reactivity of another fluoride such as a sulfur hexafluoride ($SF_6$) or a carbon tetrafluoride ($CF_4$) and a nitride semiconductor. Consequently, it is possible to prevent the first plasma processing from advancing etching of the nitride semiconductor.

Furthermore, when another fluoride such as the sulfur hexafluoride ($SF_6$) or the carbon tetrafluoride ($CF_4$) is used, sulfur (S) or carbon (C) forms a new energy state in a band gap of the nitride semiconductor. Therefore, HEMT characteristics may degrade.

The width of the fluorine region 50 is preferably 5 nm or less. A range of the etching damage in the nitride semiconductor layer, in other words, a formation range of the nitrogen vacancies is a region that is 5 nm or less from the surface of the trench 40.

The fluorine concentration of the fluorine region 50 is preferably $1 \times 10^{19}$ $cm^{-3}$ or more and $1 \times 10^{22}$ $cm^{-3}$ or less, and is more preferably $5 \times 10^{19}$ $cm^{-3}$ or more and $1 \times 10^{21}$ $cm^{-3}$ or less. When the fluorine concentration goes below the range, the nitrogen vacancies may undesirably remain. It is difficult for the fluorine concentration to exceed the range in normal manufacturing conditions.

When, for example, the trench 40 is formed by the RIE method, the etching damage is greater on the bottom surface 40a than on the side surface 40b. In this case, the number of nitrogen vacancies near the bottom surface 40a is greater than the number of nitrogen vacancies near the side surface 40b. Hence, more VN-3F structures are formed at the first portion 50a than at the second portion 50b. Consequently, the fluorine concentration of the first portion 50a is higher than the fluorine concentration of the second portion 50b.

As described above, the semiconductor device and the semiconductor device manufacturing method according to the first embodiment reduce the number of nitrogen vacancies near the bottom surface 40a and the side surface 40b of the trench 40. Consequently, it is possible to realize the HEMT 100 having the high threshold voltage.

Second Embodiment

A semiconductor device according to the second embodiment differs from the first embodiment in that a region includes one fluorine atom neighboring the three fluorine atoms, and the one fluorine atom existing in an interstitial position of the crystal lattice of the nitride semiconductor. Hereinafter, part of contents that overlaps contents of the first embodiment will be omitted.

Figure 10:
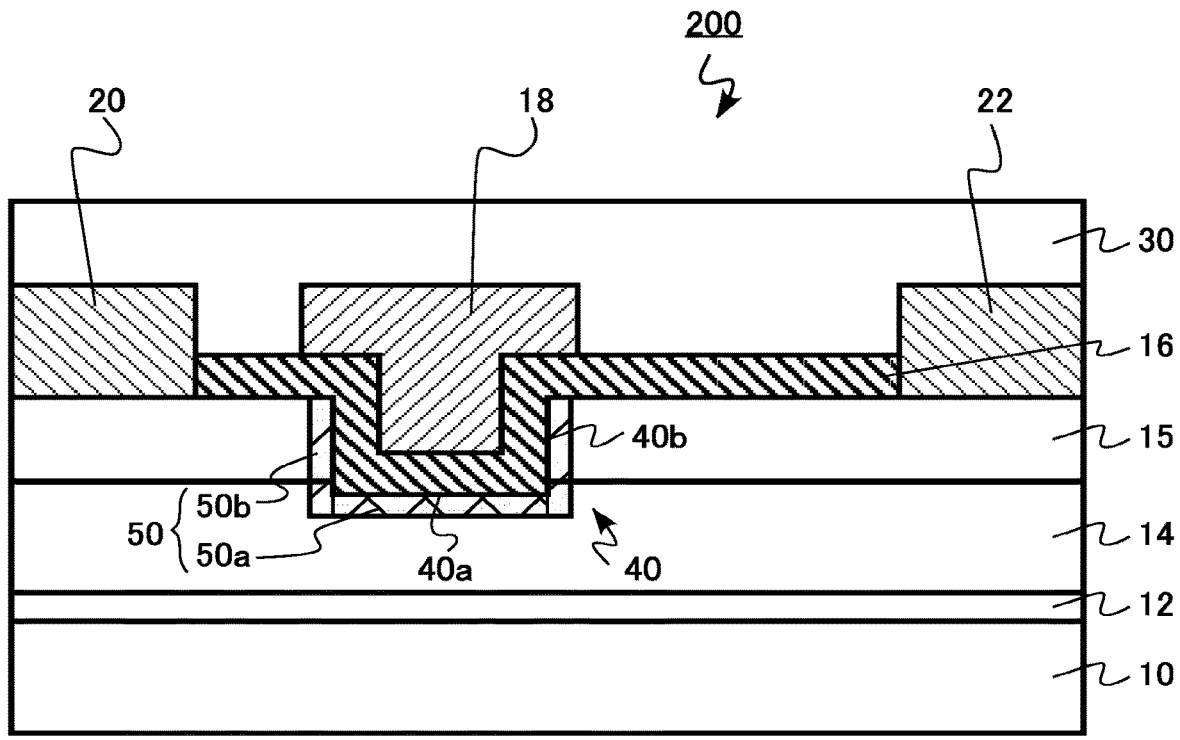
FIG. 10 is a schematic cross-sectional view of a semiconductor device according to the second embodiment.
Figure 11:
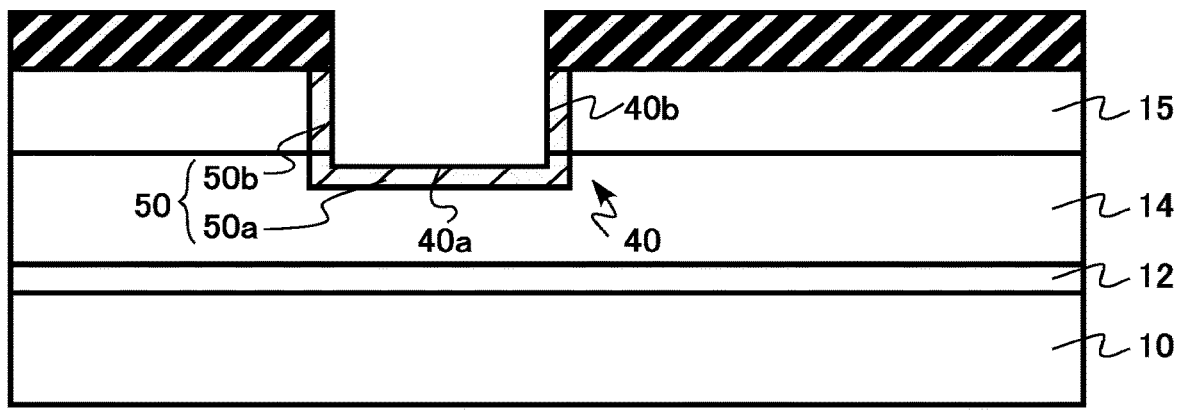
FIG. 11 is a schematic cross-sectional view illustrating a semiconductor device manufacturing method according to the second embodiment.

FIG. 10 is a schematic cross-sectional view of the semiconductor device according to the second embodiment. The semiconductor device is an HEMT 200 adopting an MIS structure for which a GaN-based semiconductor is used. The HEMT 200 includes a gate recess structure that a gate electrode is provided in a trench (recess).

The HEMT 200 includes the substrate 10, the buffer layer 12, the channel layer 14 (first nitride semiconductor layer), the barrier layer 15 (second nitride semiconductor layer), the gate insulating layer 16, the gate electrode 18, the source electrode 20 (first electrode), the drain electrode 22 (second electrode), the inter-layer insulating layer 30, the trench 40 and the fluorine region 50.

The fluorine region 50 is located in the channel layer 14 and the barrier layer 15 around the trench 40. The fluorine region 50 includes the first portion 50a and the second portion 50b. The fluorine region 50 is a nitride semiconductor containing fluorine (F).

The first portion 50a is adjacent to the bottom surface 40a of the trench 40 in the channel layer 14. The first portion 50a is located near the bottom surface 40a of the trench 40 in the channel layer 14. The first portion 50a is in contact with the bottom surface 40a of the trench 40. The second portion 50b is adjacent to and near the side surface 40b of the trench 40 in the barrier layer 15. The second portion 50b is in contact with the side surface 40b of the trench 40.

The fluorine region 50 contains three fluorine atoms existing at nitrogen atom positions of a crystal lattice of the nitride semiconductor. The fluorine region 50 contains the first fluorine atom to be bonded to the first gallium atom and the second gallium atom, the second fluorine atom to be bonded to the first gallium atom and the third gallium atom, and the third fluorine atom to be bonded to the first gallium atom and the fourth gallium atom.

The first portion 50a of the fluorine region 50 includes three fluorine atoms existing at a nitrogen atom position of the crystal lattice of the nitride semiconductor. Furthermore, the first portion 50a includes one fluorine atom located near the three fluorine atoms and existing between the lattices of the crystal lattice of the nitride semiconductor.

The first portion 50a of the fluorine region 50 includes the first fluorine atom bonded to the first gallium atom and the second gallium atom, the second fluorine atom bonded to the first gallium atom and the third gallium atom, and the third fluorine atom bonded to the first gallium atom and the fourth gallium atom. Furthermore, the first portion 50a includes a fourth fluorine atom neighboring the first fluorine atom, the second fluorine atom and the third fluorine atom. The fourth fluorine atom exists in an interstitial position of the crystal lattice of the nitride semiconductor.

The fluorine concentration of the first portion 50a is higher than the fluorine concentration of the second portion 50b. For example, the fluorine concentration of the first portion 50a is 1.1 times or more and 3.5 times or less higher than the fluorine concentration of the second portion 50b.

The fluorine concentration of the first portion 50a is preferably 1.2 times or more and 1.5 times or less.

Next, a semiconductor device manufacturing method according to the second embodiment will be described. FIGS. 11, 12, 13 and 14 are schematic cross-sectional views illustrating the semiconductor device manufacturing method according to the second embodiment.

The semiconductor device manufacturing method according to the second embodiment differs from the first embodiment in performing the first plasma processing and then performing second plasma processing in an atmosphere containing fluorine.

Processing up to and including the first plasma processing (FIG. 11) in the atmosphere containing the nitrogen trifluoride ($NF_3$) is the same as the processing in the first embodiment.

Figure 12:
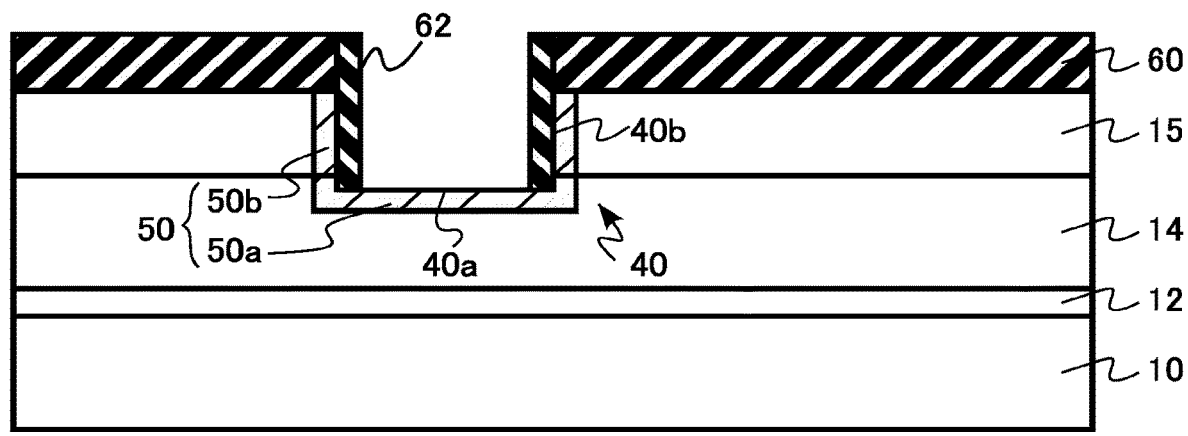
FIG. 12 is a schematic cross-sectional view illustrating a semiconductor device manufacturing method according to the second embodiment.

Next, a sidewall 62 that covers the side surface 40b of the trench 40 is formed (FIG. 12). The bottom surface 40a of the trench 40 is exposed. The sidewall 62 is, for example, a silicon nitride film. For example, the silicon nitride film is deposited by the CVD method and etched by the RIE method to form the sidewall 62.

Figure 13:
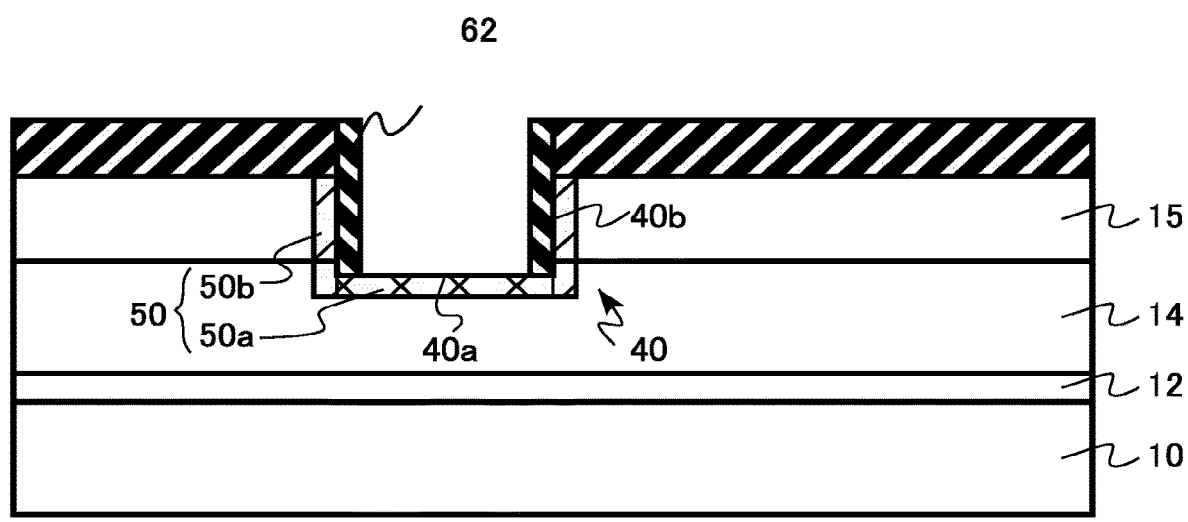
FIG. 13 is a schematic cross-sectional view illustrating a semiconductor device manufacturing method according to the second embodiment.

Next, the second plasma processing is performed in the atmosphere containing fluorine (FIG. 13). Fluorine atoms are supplied from the exposed bottom surface 40a of the trench 40 into the channel layer 14. One fluorine atom is fixed near the three fluorine atoms that have filled nitrogen vacancies. One fluorine atom is located between the lattices of the crystal lattice of the nitride semiconductor.

Figure 14:
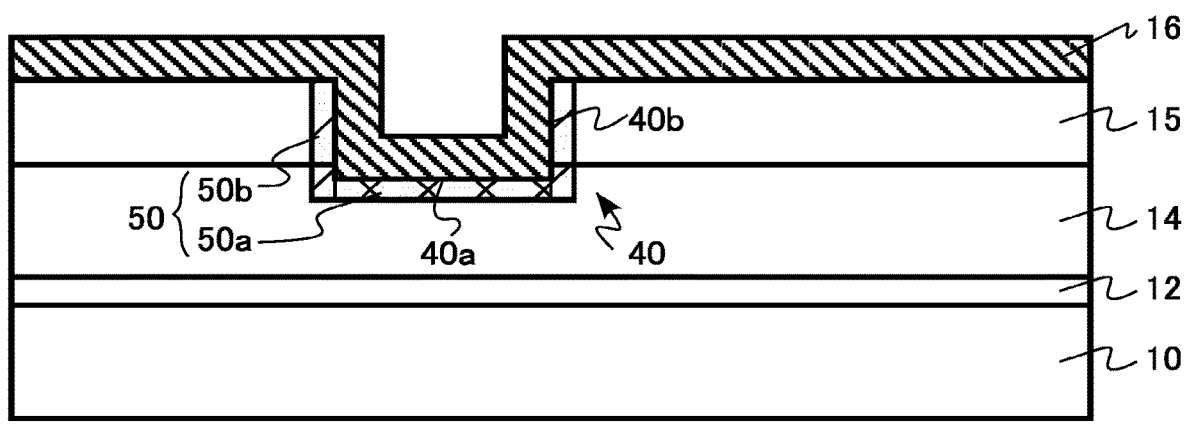
FIG. 14 is a schematic cross-sectional view illustrating the semiconductor device manufacturing method according to the second embodiment.

Next, the gate insulating layer 16 is formed on the channel layer 14 and the barrier layer 15 (FIG. 14). The gate insulating layer 16 is an oxide or an oxynitride. The gate insulating layer 16 is, for example, a silicon oxide, an aluminum oxide, a silicon oxynitride or an aluminum oxynitride. An amorphous $Si_3N_4$ film that is 0.5 nm or more and less than 5 nm or a crystallized AlN film that is 0.5 nm or more and less than 5 nm is preferably inserted in the interface between the channel layer 14 and the gate insulating layer 16, and between the barrier layer 15 and the gate insulating layer 16 from a viewpoint of prevention of nitrogen out diffusion from the channel layer 14 and the barrier layer 15. When the amorphous $Si_3N_4$ film or the crystallized AlN film is less than 0.5 nm, the amorphous $Si_3N_4$ film or the crystallized AlN film hardly functions as a nitrogen supply source. When the amorphous Si—$N_4$ film or the crystallized AlN film is 5 nm or more, the amorphous $Si_3N_4$ film or the crystallized AlN film is likely to become a trap.

The gate insulating layer 16 is formed by, for example, the CVD method.

Next, heat processing is performed at 800° C. or more and 1000° C. or less. The gate insulating layer 16 is densified by the heat processing.

Subsequently, the source electrode 20, the drain electrode 22 and the inter-layer insulating layer 30 are formed by the same method as the method according to the first embodiment.

According to the above manufacturing method, the HEMT 200 illustrated in FIG. 10 is formed.

A function and an effect of the semiconductor device and the semiconductor device manufacturing method according to the second embodiment will be described.

Figure 15:
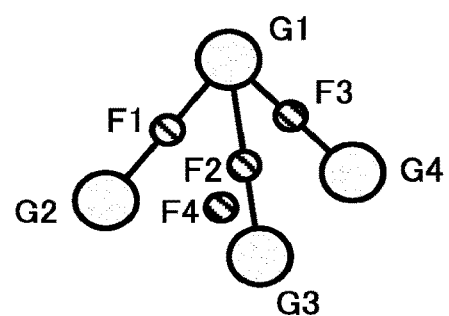
FIG. 15 is an explanatory view of a function and an effect of the second embodiment.

FIG. 15 is an explanatory view of the function and the effect of the second embodiment. FIG. 15 illustrates a tetrahedral structure formed by gallium atoms existing in the crystalline structure of a gallium nitride. FIG. 15 illustrates the structure according to the second embodiment.

The first portion 50a of the fluorine region 50 according to the second embodiment includes the structure illustrated in FIG. 15. That is, the first portion 50a includes three fluorine atoms existing at nitrogen atom positions of the crystal lattice of the gallium nitride. Furthermore, this structure includes one fluorine atom located near the three fluorine atoms and existing between lattices of the crystal lattice of the gallium nitride.

More specifically, the structure included in the first portion 50a includes the first fluorine atom (F1) to be bonded to the first gallium atom (G1) and the second gallium atom (G2), the second fluorine atom (F2) to be bonded to the first gallium atom (G1) and the third gallium atom (G3), and the third fluorine atom (F3) to be bonded to the first gallium atom (G1) and the fourth gallium atom (G4). Furthermore, the structure includes a fourth fluorine atom (F4) located near the first fluorine atom (F1), the second fluorine atom (F2) and the third fluorine atom (F3), and existing between the lattices of the crystal lattice of the gallium nitride. Hereinafter, the structure in FIG. 15 will be referred to as a VN-3FF structure.

In addition, "near the first fluorine atom (F1), the second fluorine atom (F2) and the third fluorine atom (F3)" means a region in which distances from the first fluorine atom (F1), the second fluorine atom (F2) and the third fluorine atom (F3) are closer than a distance between gallium atoms for forming the tetrahedral structure. For example, the distances between the first fluorine atom (F1), the second fluorine atom (F2) and the third fluorine atom (F3), and the fourth fluorine atom (F4) are 0.5 nm or less.

In the first plasma processing, $NF_3$ processing is performed. The VN-3F structure that three fluorine atoms (F) are provided nearby is formed by the $NF_3$ processing. It is necessary to additionally supply F to form the VN-3FF structure to which F is further bonded. In this case, although most of the structure to which F has been additionally supplied adopt an inter-lattice Fi structure, the VN-3FF structure can be formed by long term annealing. The Fi structure is diffused outward by the heat processing. However, the VN-3FF structure is stable, and has a negative electric charge. By dividing plasma processing into $NF_3$ processing and $F_2$ processing, it is possible to separately use the VN-3F structure and the VN-3FF structure.

When, for example, $CF_4$ processing or $SF_6$ processing is performed, the VN-3FF structure can be formed from an initial stage. Therefore, it is not possible to separately use the VN-3F structure (a structure that is not charged up) and the VN-3FF structure (a structure in which F is introduced between lattices near the VN-3F structure and that is negatively charged up). Use of $CF_4$ or $SF_6$ brings about not only a disadvantage that carbon (C) or sulfur (S) is diffused in a nitride and forms a trap but also a disadvantage that the VN-3F structure and the VN-3FF structure cannot be separately used.

Whether or not one fluorine atom exists between lattices of a crystal lattice of a nitride semiconductor can be determined by, for example, XPS. Furthermore, whether or not the one fluorine atom existing between the lattices of the crystal lattice of the nitride semiconductor is located near the three fluorine atoms can be determined by, for example, XAFS.

The first principles calculation by the inventors has revealed that the VN-3FF structure illustrated in FIG. 15 is stable compared to a case where fluorine atoms alone exist between the lattices of the crystal lattice of the gallium nitride. More specifically, it has been found that the VN-3FF structure provides 2.2 eV in an energy gain compared to a case where the fluorine atoms alone exist between the lattices.

Figure 16A:
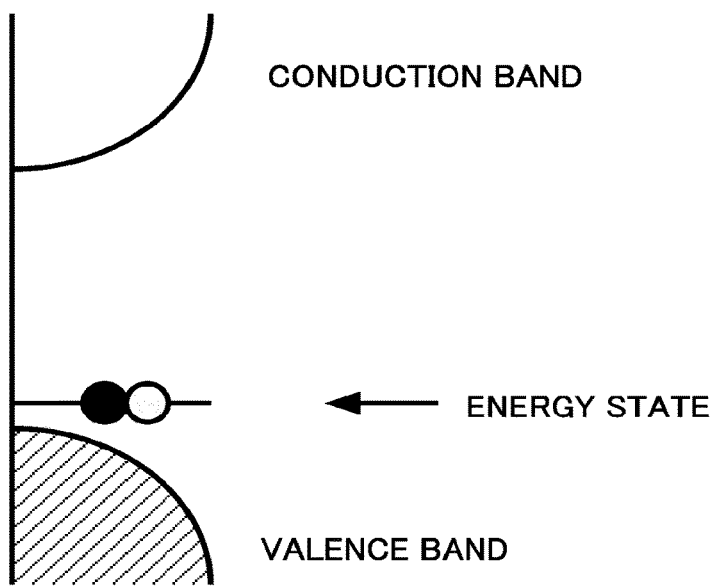
FIGS. 16A and 16B are explanatory views of the function and the effect of the second embodiment.
Figure 16B:
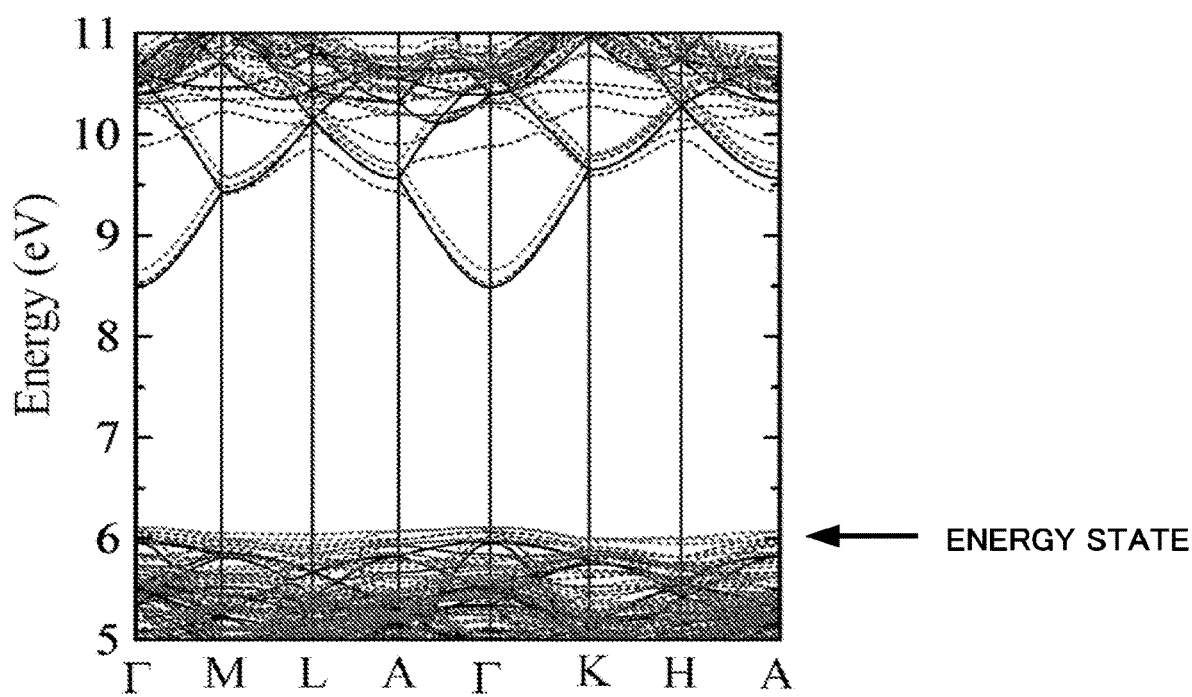

FIGS. 16A and 16B are explanatory views of the function and the effect of the second embodiment. FIGS. 16A and 16B are explanatory views of the VN-3FF structure. FIG. 16A is a schematic view of a band structure, and FIG. 16B illustrates a calculation result of the band structure according to the first principles calculation.

As illustrated in FIGS. 16A and 16B, an energy state is formed near an upper end of a valence band of the gallium nitride. In addition, a black circle in FIG. 16A indicates an energy state filled with electrons, and a white circle indicates an energy state that are not filled with electrons. The energy state formed by a structure that the four fluorine atoms exist nearby is near the upper end of the valence band, and becomes an acceptor level for receiving electrons. The energy state formed by the VN-3FF structure generates negative fixed charges.

The negative fixed charges are generated at the first portion 50a of the channel layer 14 directly below the gate electrode 18, so that a potential of the channel layer 14 is increased to form an electron barrier. Consequently, it is possible to realize the HEMT 200 having the high threshold voltage.

According to the semiconductor device manufacturing method according to the second embodiment, a damage when the trench 40 is formed by the RIE method contributes to formation of a great number of nitrogen vacancies in the nitride semiconductor layer. Hence, a great number of VN-3F structures are formed in the nitride semiconductor layer by the first plasma processing. The great number of VN-3F structures and fluorine introduced by the second plasma processing exist nearby, so that the great number of VN-3FF structures are formed in the nitride semiconductor layer. Consequently, it is possible to generate a great number of negative fixed charges in the nitride semiconductor layer. Consequently, it is possible to substantially increase the threshold voltage of the HEMT 200.

The number of VN-3FF structures in the second portion 50b is smaller than the number of VN-3FF structures in the first portion 50a. By forming the sidewall 62 that covers the side surface 40b of the trench 40 during the second plasma processing, the number of VN-3FF structures in the second portion 50b becomes smaller than the number of VN-3FF structures in the first portion 50a. As a result, the fluorine concentration of the first portion 50a is higher than the fluorine concentration of the second portion 50b.

The number of negative fixed charges in the second portion 50b is small. Consequently, a decrease in a 2DEG concentration directly below the second portion 50b is suppressed. Consequently, a decrease in on-resistance of the HEMT 200 is suppressed. In addition, from a viewpoint of simplification of the manufacturing method and reduction in manufacturing cost, it is also possible to omit formation of the sidewall 62.

As described above, the VN-3FF structure is stable compared to the structure that fluorine atoms alone exist between lattices of the crystal lattice of the gallium nitride. Consequently, even when, for example, heat processing for densifying the gate insulating layer 16 is performed at a temperature equal to or more than 800° C. after the second plasma processing, release of the fluorine atoms from the VN-3FF structure is suppressed.

In addition, the temperature of the heat processing after formation of the gate insulating layer 16 is preferably 800° C. or more and 1000° C. or less. When the temperature goes below this range, a densifying effect of the gate insulating layer 16 may not be undesirably obtained. Furthermore, when the temperature exceeds this range, fluorine atoms may be undesirably released from the VN-3FF structure.

An example where the second plasma processing is performed in a state where the bottom surface 40a of the trench 40 is exposed has been described. However, the second plasma processing can be also performed after, for example, the sidewall 62 is formed and then a thin silicon oxide film less than 10 nm is formed. When the silicon oxide film equal to or more than 10 nm is formed, plasma is deactivated. Hence, when a thick insulating film is necessary, the insulating film is stacked thick, and is densified and annealed at 1000° C. or less.

Figure 17A:
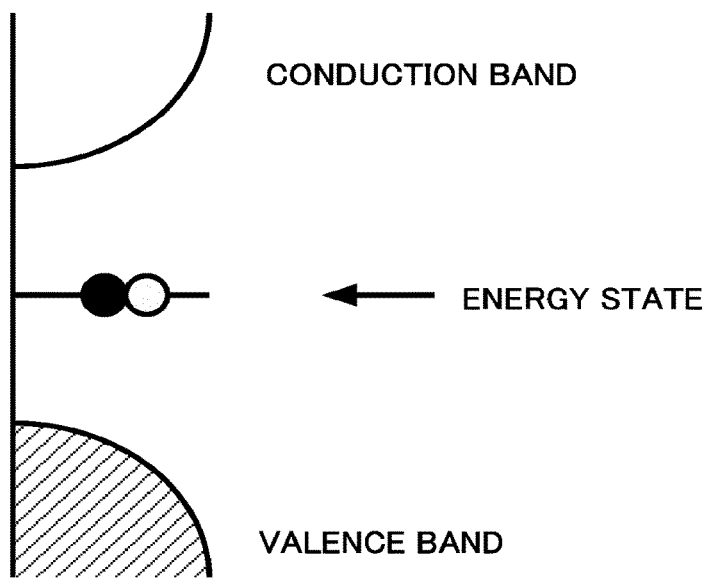
FIGS. 17A and 17B are explanatory views of the function and the effect of the second embodiment.
Figure 17B:
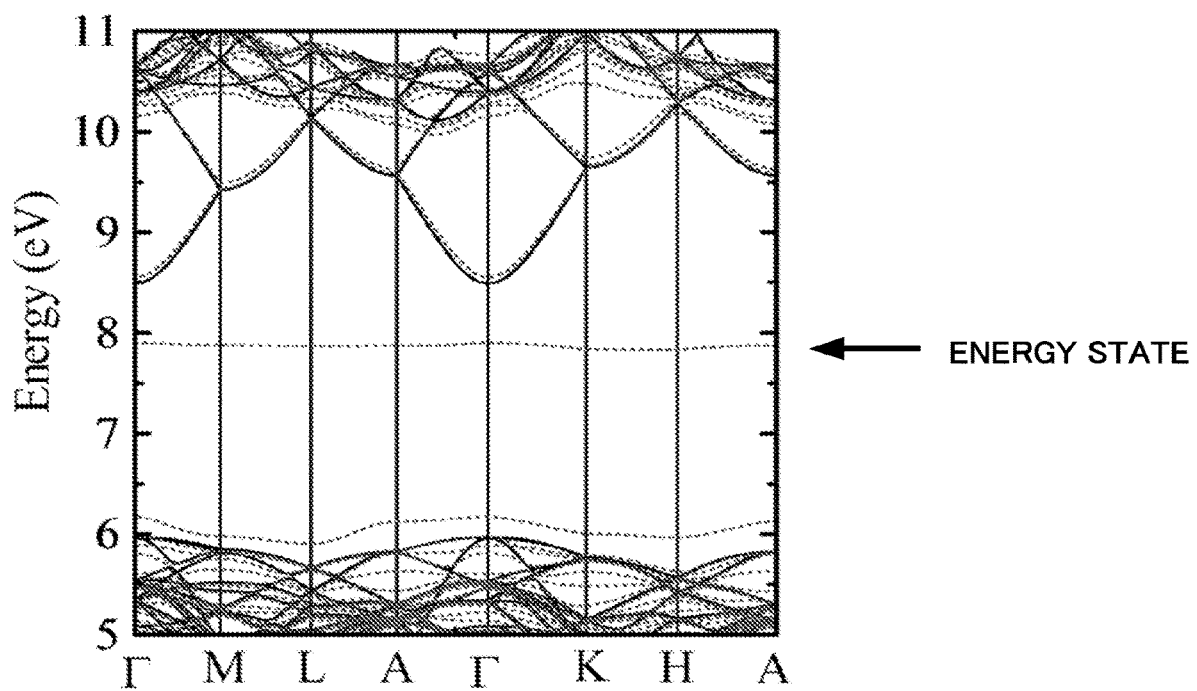

FIGS. 17A and 17B are explanatory views of the function and the effect of the second embodiment. FIGS. 17A and 17B are explanatory views of a structure that four hydrogen (H) atoms exist at a lattice position of nitrogen atoms of the gallium nitride. FIG. 17A is a schematic view of a band structure, and FIG. 17B illustrates a calculation result of the band structure according to first principles calculation.

A structure that a nitrogen vacancy is filled with the four hydrogen atoms is also stable in terms of energy. However, as illustrated in FIGS. 17A and 17B, four hydrogen (H) atoms form an energy state near an intermediate band between a valence band of the gallium nitride and a conduction band. In addition, a black circle in FIG. 17A indicates an energy state filled with electrons, and a white circle indicates an energy state that are not filled with electrons.

The energy state near the intermediate band between the valence band and the conduction band does not stabilize a polarity of charges. Therefore, HEMT characteristics do not stabilize. Therefore, the VN-3FF structure is better than the structure that the nitrogen vacancies are filled with the four hydrogen atoms.

As described above, the semiconductor device and the semiconductor device manufacturing method according to the second embodiment reduce the number of nitrogen vacancies near the bottom surface 40a and the side surface 40b of the trench 40. Furthermore, negative fixed charges are generated near the bottom surface 40a of the trench 40. Consequently, it is possible to realize the HEMT 200 having a higher threshold voltage than the threshold voltage of the HEMT 100 according to the first embodiment.

Third Embodiment

A semiconductor device according to the third embodiment differs from the first embodiment in that a bottom surface is located in a second nitride semiconductor layer. Hereinafter, part of contents that overlaps contents of the first embodiment will be omitted.

Figure 18:
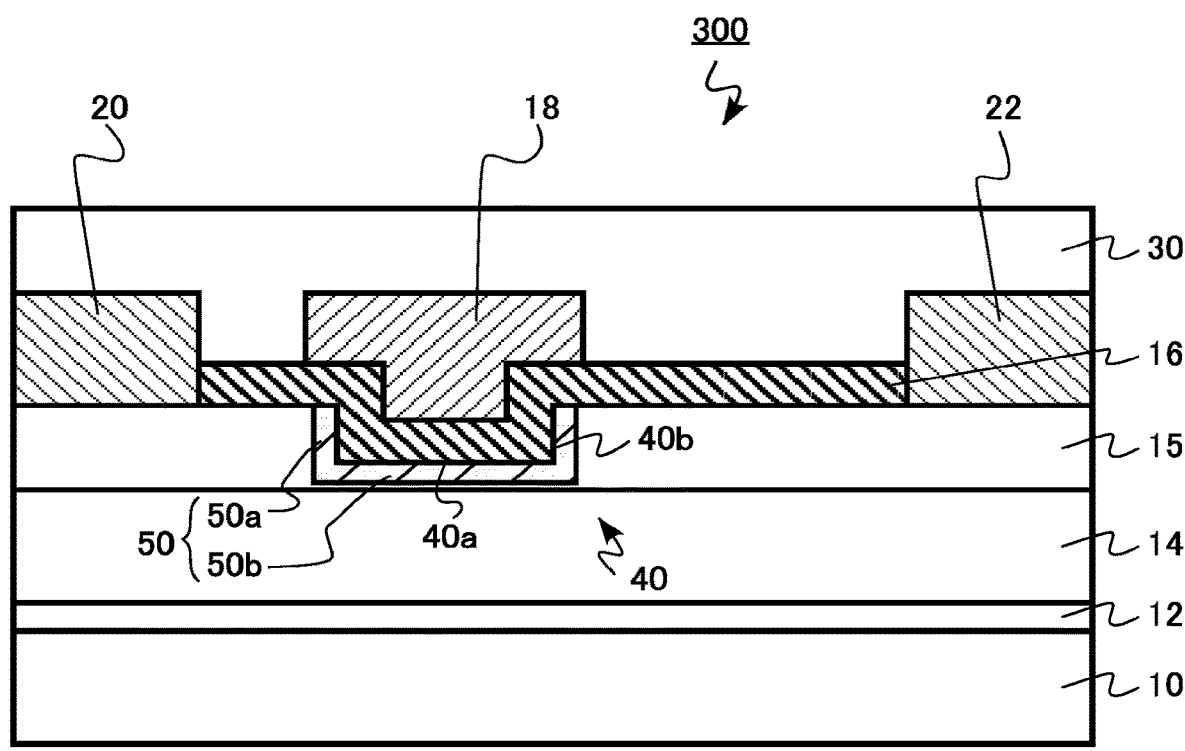
FIG. 18 is a schematic cross-sectional view of a semiconductor device according to a third embodiment.

FIG. 18 is a schematic cross-sectional view of the semiconductor device according to the third embodiment. The semiconductor device is an HEMT 300 adopting an MIS structure for which a GaN-based semiconductor is used. The HEMT 300 includes a gate recess structure that a gate electrode is provided in a trench (recess).

The HEMT 300 includes the substrate 10, the buffer layer 12, the channel layer 14 (first nitride semiconductor layer), the barrier layer 15 (second nitride semiconductor layer), the gate insulating layer 16, the gate electrode 18, the source electrode 20 (first electrode), the drain electrode 22 (second electrode), the inter-layer insulating layer 30, the trench 40 and the fluorine region 50 (region).

The trench 40 includes the bottom surface 40a and the side surface 40b. The bottom surface 40a of the trench 40 is located in the barrier layer 15. The gate insulating layer 16 and the gate electrode 18 are formed in the trench 40. The thickness of the barrier layer 15 directly below the bottom surface 40a of the trench 40 becomes thin, and the density of the two dimensional electron gas below the gate electrode 18 is reduced. Consequently, it is possible to realize a normally off operation.

The fluorine region 50 is located in the barrier layer 15 around the trench 40. The fluorine region 50 includes the first portion 50a and the second portion 50b. The fluorine region 50 is the nitride semiconductor containing fluorine (F).

Similarly to the first embodiment, the semiconductor device according to the third embodiment includes the fluorine region 50, so that the number of nitrogen vacancies near the bottom surface 40a and the side surface 40b of the trench 40 is reduced. Consequently, it is possible to realize the HEMT 300 having the high threshold voltage.

Fourth Embodiment

A power supply circuit and a computer according to the fourth embodiment include the HEMT according to the first to third embodiments.

Figure 19:
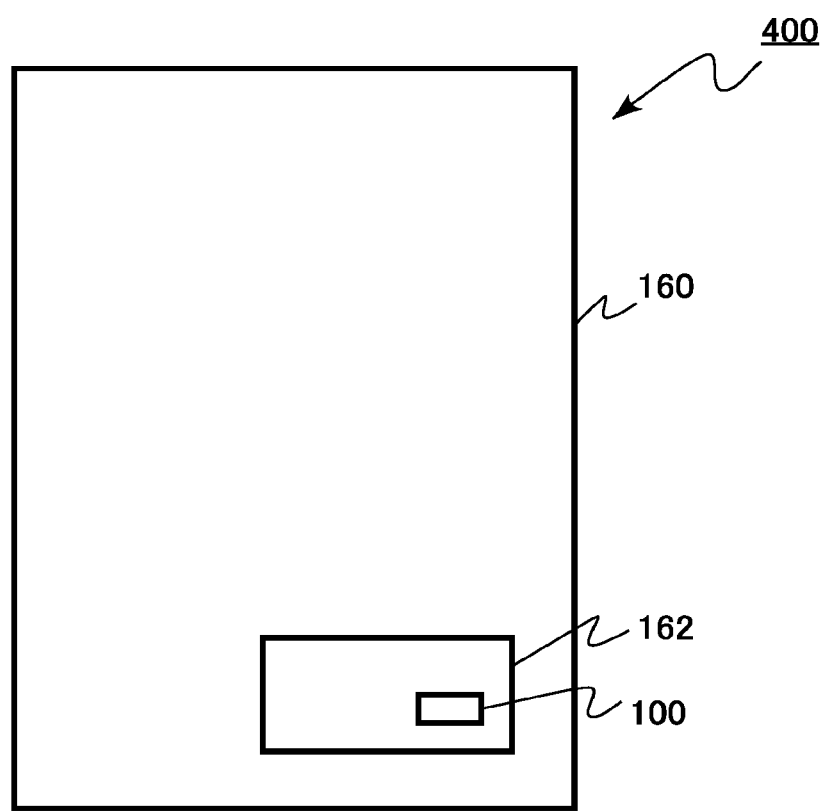
FIG. 19 is a schematic view of a computer according to a fourth embodiment.

FIG. 19 is a schematic view of the computer according to the fourth embodiment. The computer according to the fourth embodiment is, for example, a server 400.

The server 400 includes a power supply circuit 162 in a housing 160. The server 400 is the computer that operates server software. The power supply circuit 162 includes, for example, the HEMT 100 according to the first embodiment.

The power supply circuit 162 includes the HEMT 100 having a high threshold voltage, and consequently can realize a stable operation. Furthermore, the server 400 includes the power supply circuit 162, and consequently can realize a stable operation.

According to the fourth embodiment, it is possible to realize the power supply circuit and the computer that realize the stable operation.

The first to third embodiments have described a nitride semiconductor by using a gallium nitride or an aluminum gallium nitride containing gallium (Ga) as an example. However, for example, an indium gallium nitride or an indium aluminum gallium nitride containing indium (In) is also applicable. An aluminum nitride, an indium nitride and an indium aluminum nitride that do not contain Ga are also applicable. Furthermore, a stacked structure of any of the above nitride semiconductors is also applicable.

Furthermore, the first to third embodiments have described the barrier layer 15 by using the undoped aluminum gallium nitride as an example. However, an n-type aluminum gallium nitride is also applicable.

Furthermore, a structure that the aluminum gallium nitride, the aluminum nitride or the like is grown again at a bottom portion of a trench is also applicable.

Furthermore, the gate insulating layer 16 may contain, for example, a nitride. The gate insulating layer 16 is, for example, a silicon nitride or an aluminum nitride. Furthermore, the gate insulating layer 16 may be different stacked films at a portion in contact with the channel layer 14 and at a portion in contact with the barrier layer 15.

Some embodiments of the present invention have been described. However, these embodiments are presented as exemplary embodiments, and not intended to limit the scope of the invention. These new embodiments can be carried out in other various modes, and can be variously omitted, replaced or changed without departing from the scope of the invention. For example, components of one embodiment may be replaced with or changed for components of another embodiment. These embodiments and modifications of the embodiments are incorporated in the scope and the gist of the invention, and are incorporated in a range of the invention recited in the claims and equivalents of the invention.

While certain embodiments have been described, these embodiments have been presented by way of example only, and are not intended to limit the scope of the inventions. Indeed, the semiconductor device, the semiconductor device manufacturing method, the power supply circuit and the computer described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first nitride semiconductor layer;
   a second nitride semiconductor layer located on the first nitride semiconductor layer, and the second nitride semiconductor layer having a larger band gap than a band gap of the first nitride semiconductor layer;
   a first electrode located on or above the first nitride semiconductor layer, and the first electrode electrically connected to the first nitride semiconductor layer;
   a second electrode located on or above the first nitride semiconductor layer, and the second electrode electrically connected to the first nitride semiconductor layer;
   a trench located in the second nitride semiconductor layer between the first electrode and the second electrode, the trench including a bottom surface and a side surface, and the bottom surface being located in one of the first nitride semiconductor layer and the second nitride semiconductor layer;
   a gate electrode located in the trench;
   a gate insulating layer located between the bottom surface and the gate electrode and between the side surface and the gate electrode; and
   a region located in at least one of the first nitride semiconductor layer and the second nitride semiconductor layer, the region including a first portion adjacent to the bottom surface, and the region containing fluorine.

2. The semiconductor device according to claim 1, wherein the region includes a second portion adjacent to the side surface.

3. The semiconductor device according to claim 2, wherein a fluorine concentration of the first portion is higher than a fluorine concentration of the second portion.

4. The semiconductor device according to claim 1, wherein a width of the region is 5 nm or less.

5. The semiconductor device according to claim 1, wherein the region includes three fluorine atoms existing at a nitrogen atom position of a crystal lattice of a nitride semiconductor.

6. The semiconductor device according to claim 5, wherein the region includes one fluorine atom neighboring the three fluorine atoms, and the one fluorine atom existing in an interstitial position of the crystal lattice of the nitride semiconductor.

7. The semiconductor device according to claim 1, wherein the region includes a first fluorine atom bonded to a first atom and a second atom, a second fluorine atom bonded to the first atom and a third atom, a third fluorine atom bonded to the first atom and a fourth atom, the first atom is an atom selected from the group consisting of gallium atom, aluminum atom and indium atom, the second atom is an atom selected from the group consisting of gallium atom, aluminum atom and indium atom, the third atom is an atom selected from the group consisting of gallium atom, aluminum atom and indium atom, and the fourth atom is an atom selected from the group consisting of gallium atom, aluminum atom and indium atom.

8. The semiconductor device according to claim 7, wherein the region includes a fourth fluorine atom neighboring the first fluorine atom, the fourth fluorine atom neighboring the second fluorine atom, the fourth fluorine atom neighboring the third fluorine atom, and the fourth fluorine atom existing in an interstitial position of the crystal lattice of a nitride semiconductor.

9. The semiconductor device according to claim 1, wherein a fluorine concentration of the region is $1\times10^{19}$ $cm^{-3}$ or more and $1\times10^{22}$ $cm^{-3}$ or less.

10. The semiconductor device according to claim 1, wherein the first nitride semiconductor layer is a gallium nitride, and the second nitride semiconductor layer is an aluminum gallium nitride.

11. A power supply circuit comprising the semiconductor device according to claim 1.

12. A computer comprising the semiconductor device according to claim 1.

* * * * *